(12) United States Patent
Selvaraj et al.

(10) Patent No.: US 11,156,640 B2
(45) Date of Patent: Oct. 26, 2021

(54) MEMS PROBE CARD ASSEMBLY HAVING DECOUPLED ELECTRICAL AND MECHANICAL PROBE CONNECTIONS

(71) Applicant: FormFactor, Inc., Livermore, CA (US)

(72) Inventors: Mukesh Selvaraj, San Francisco, CA (US); January Kister, Portola Valley, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/175,341

(22) Filed: Oct. 30, 2018

(65) Prior Publication Data

US 2019/0128924 A1 May 2, 2019

Related U.S. Application Data

(60) Provisional application No. 62/579,584, filed on Oct. 31, 2017.

(51) Int. Cl.
    *G01R 1/073* (2006.01)
    *G01R 1/067* (2006.01)
    *G01R 3/00* (2006.01)

(52) U.S. Cl.
    CPC ..... *G01R 1/07378* (2013.01); *G01R 1/06722* (2013.01); *G01R 3/00* (2013.01)

(58) Field of Classification Search
    CPC .. G01R 3/00; G01R 1/06722; G01R 1/06761; G01R 1/07342; G01R 1/07371; G01R 1/07378; H01L 41/47
    See application file for complete search history.

(56) References Cited

U.S. PATENT DOCUMENTS

| | | | |
|---|---|---|---|
| 5,806,181 A | 9/1998 | Khandros | |
| 6,066,957 A | 5/2000 | Van Loan | |
| 6,870,382 B2 | 3/2005 | Harris | |
| 7,349,223 B2 | 3/2008 | Haemer | |
| 9,588,139 B2 | 3/2017 | Fan | |
| 2002/0025603 A1* | 2/2002 | Ondricek | H01L 21/67294 438/117 |
| 2002/0048973 A1 | 4/2002 | Zhou | |
| 2002/0153912 A1 | 10/2002 | Di Stefano | |
| 2003/0222667 A1 | 12/2003 | Khandros | |
| 2008/0061808 A1 | 3/2008 | Mok | |
| 2010/0176831 A1 | 7/2010 | Palcisko | |

(Continued)

FOREIGN PATENT DOCUMENTS

WO WO03048788 6/2003

*Primary Examiner* — Son T Le
*Assistant Examiner* — Adam S Clarke
(74) *Attorney, Agent, or Firm* — Lumen Patent Firm

(57) ABSTRACT

Probes are connected to the space transformer via multiple carrier plates. Electrical contacts from the probes to the space transformer are by way of spring tail features on the probes that connect to the space transformer and not to the carrier plates. In other words, the carrier plates are purely mechanical in function. This configuration can significantly reduce probe array fabrication time relative to sequential placement of individual probes on the space transformer. Multiple probe carrier plates can be populated with probes in parallel, and the final sequential assembly of carrier plates onto the space transformer has a greatly reduced operation count. Deviations of the space transformer from flatness can be compensated for.

8 Claims, 10 Drawing Sheets

(56) References Cited

U.S. PATENT DOCUMENTS

| | | | |
|---|---|---|---|
| 2010/0308854 A1 | 12/2010 | Garabedian | |
| 2011/0032063 A1* | 2/2011 | Dang | G01R 31/2889 |
| | | | 336/192 |
| 2014/0327461 A1 | 11/2014 | Fan | |
| 2015/0061718 A1* | 3/2015 | Chan | G01R 31/2886 |
| | | | 324/756.03 |
| 2016/0118738 A1* | 4/2016 | Nasu | G01R 1/06722 |
| | | | 439/700 |
| 2016/0274147 A1* | 9/2016 | Hsu | G01R 1/07378 |
| 2017/0146569 A1* | 5/2017 | Shimizu | G01R 31/2601 |
| 2019/0137545 A1 | 5/2019 | Reischl | |

* cited by examiner

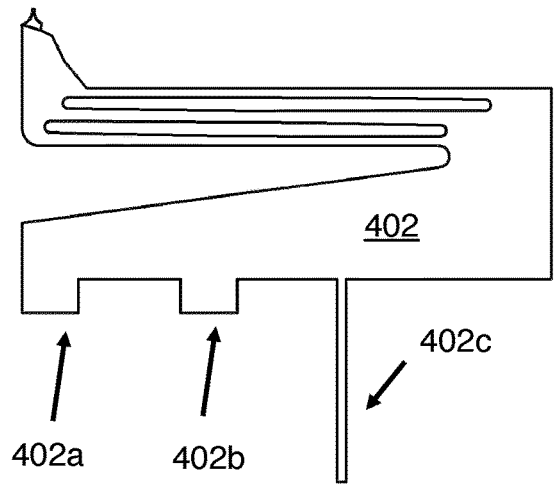
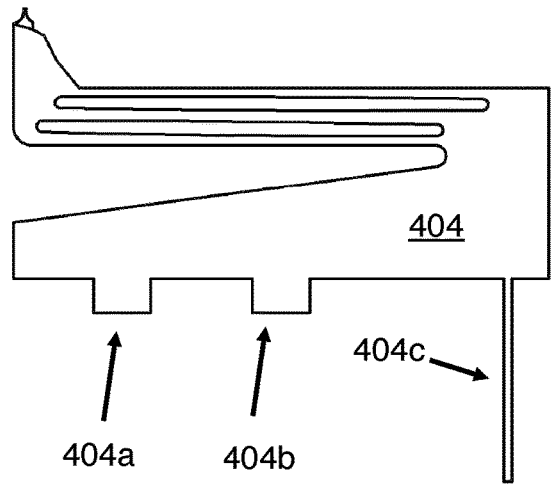
FIG. 4A  FIG. 4B
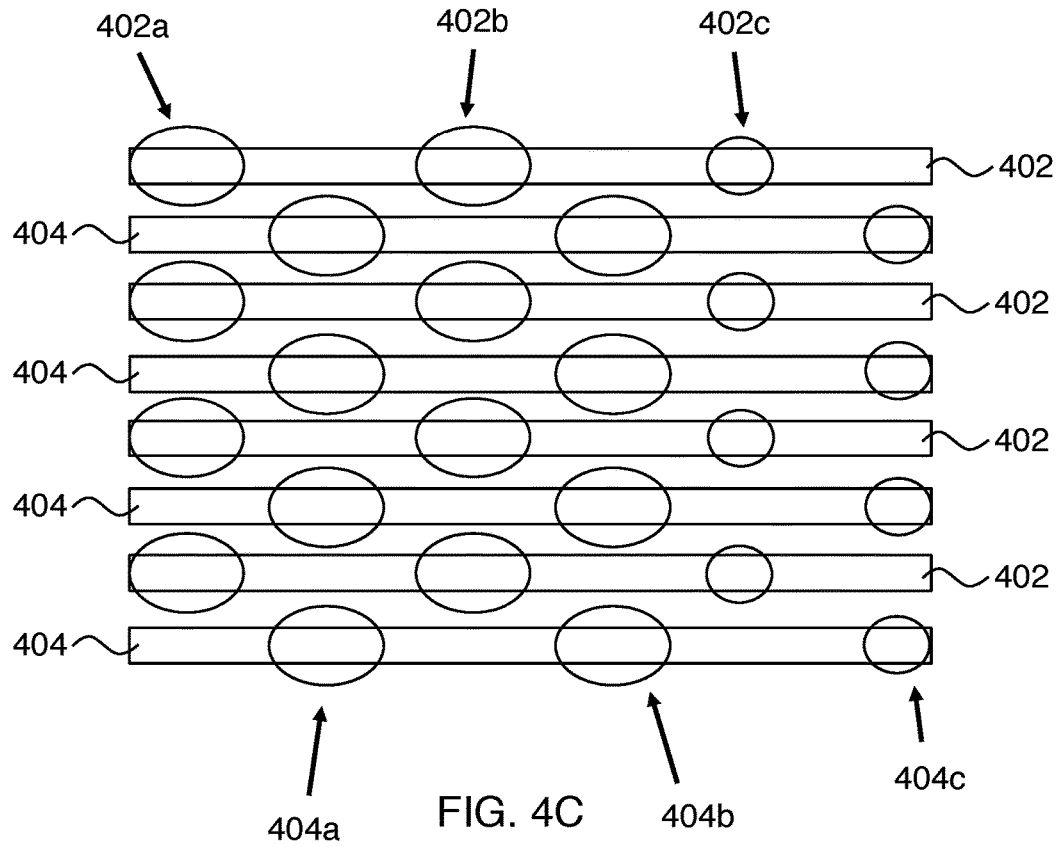
FIG. 4C

MEMS PROBE CARD ASSEMBLY HAVING DECOUPLED ELECTRICAL AND MECHANICAL PROBE CONNECTIONS

CROSS REFERENCE TO RELATED APPLICATIONS

This application claims the benefit of U.S. provisional patent application 62/579,584, filed on Oct. 31, 2017, and hereby incorporated by reference in its entirety.

FIELD OF THE INVENTION

This invention relates to probe arrays for testing electrical devices and circuits.

BACKGROUND

Testing of electrical devices and circuits often requires large arrays of probes to make contact to devices under test. Conventionally, each of the probes is individually mounted to a space transformer that provides an electrical interface between the probe array and the test instrumentation. Space transformers tend to be custom parts because the required probe array pattern will vary from circuit to circuit and from customer to customer. So the conventional approach as outlined above will have a lead time that is a combination of the time needed to make the space transformer, plus the time needed to populate it with the probes. Since probe arrays can have 100,000 probes or more, the time needed to populate a probe array can be lengthy, even with state of the part pick and place robotic technology. Since these are custom parts, they can't be fabricated in advance, meaning that the time needed to populate the space transformer with probes is a highly undesirable customer facing lead time. Accordingly, it would be an advance in the art to provide a faster approach for populating probe arrays.

SUMMARY

In this work, probes are connected to the space transformer via multiple carrier plates where the connections between probes and carrier plates are mechanically non-compliant (to simplify probe design). Electrical contacts from the probes to the space transformer are by way of mechanically compliant spring tail features on the probes that connect to the space transformer and not to the carrier plates. In other words, the carrier plates are purely mechanical in function. A further refinement of the basic idea is that deviations of the space transformer from flatness can be compensated for.

The multiple carrier plates enable parallel processing efficiency for probe assembly. Attaching probes directly to the space transformer requires sequential pick and place operation of the probes with cumulatively long process times. Multiple carrier plates designed based on Device under Test (DUT) layouts allow for parallel processing and probes can be assembled even before the space transformer is available. Once the space transformer is fabricated, the pre-assembled carrier plates can now be attached using a robot in a very short time frame compared to traditional probe cards. Considering that the number of probes can reach above 100,000 for probe cards, sequential one-by-one probe attachment on a space transformer can take over 11 days at 10 seconds per probe using 24 hours and 7 working days after receiving the space transformer. For multiple carrier plates we can use multiple robots to assemble the probes in parallel and complete the probe attachment in much shorter time frame.

The carrier plates can be fabricated in different shapes and form corresponding to device under test layout. There can be more than one design of carrier plate within a probe card dependent on the IC chip pad layout.

Although this concept is applicable to any kind of probe, it is preferred to practice it in connection with MEMS (microelectromechanical systems) probes, since such probes can readily be fabricated with the various features as described below. Here MEMS probes are defined as any probes fabricated with MEMS technology, especially in silicon. The probe preferably has alignment features that can be used for pick and place operation and assists the probes to be positioned in six degrees of freedom. Alignment features can all be positioned within the MEMS spring body to enable accurate positioning of the spring tip relative to all other spring tips of the array. One such alignment feature is the spring feet which are used for bonding probes to the carrier plate. The bonding material is preferably designed to have very low shrinkage during post processing such as thermal, UV, laser, hot air etc. and forms a firm bonding connection between the MEMS probe feet and carrier plate. Geometrical modifications such as holes, grooves, teeth, hill and valley to the MEMS probe feet can be used to improve adhesion and prevent bonding material from wicking up beyond the feet due to surface tension and capillary action. Another method to prevent wicking up of bonding material is to coat the MEMS probe with metals such as Aluminum, Nickel, Titanium, Tungsten, Molybdenum, etc. and parylene.

The tips of the probes in such an array need to be coplanar to a high degree of accuracy (25 um), which can cause difficulties with the permanent electrical connections between the probes and the rest of the test fixture. For example, if the probes are individually connected to the space transformer, then any deviations of the space transformer from perfect flatness will undesirably show up in corresponding deviations of the probe tips from flatness. Use of multiple probe carrier plates can efficiently provide compensation for such deviations from planarity. For example, this compensation can be provided by connecting individual probe carriers to the space transformer with a bonding process capable of providing individual vertical positioning of bonded probe carrier plates with a variable bond thickness such that all of the probe tips of the resulting probe array are coplanar to the required accuracy.

BRIEF DESCRIPTION OF THE DRAWINGS

FIGS. 4A-C show a first exemplary approach for close packing probes on a carrier plate.

DETAILED DESCRIPTION

Figure 1:
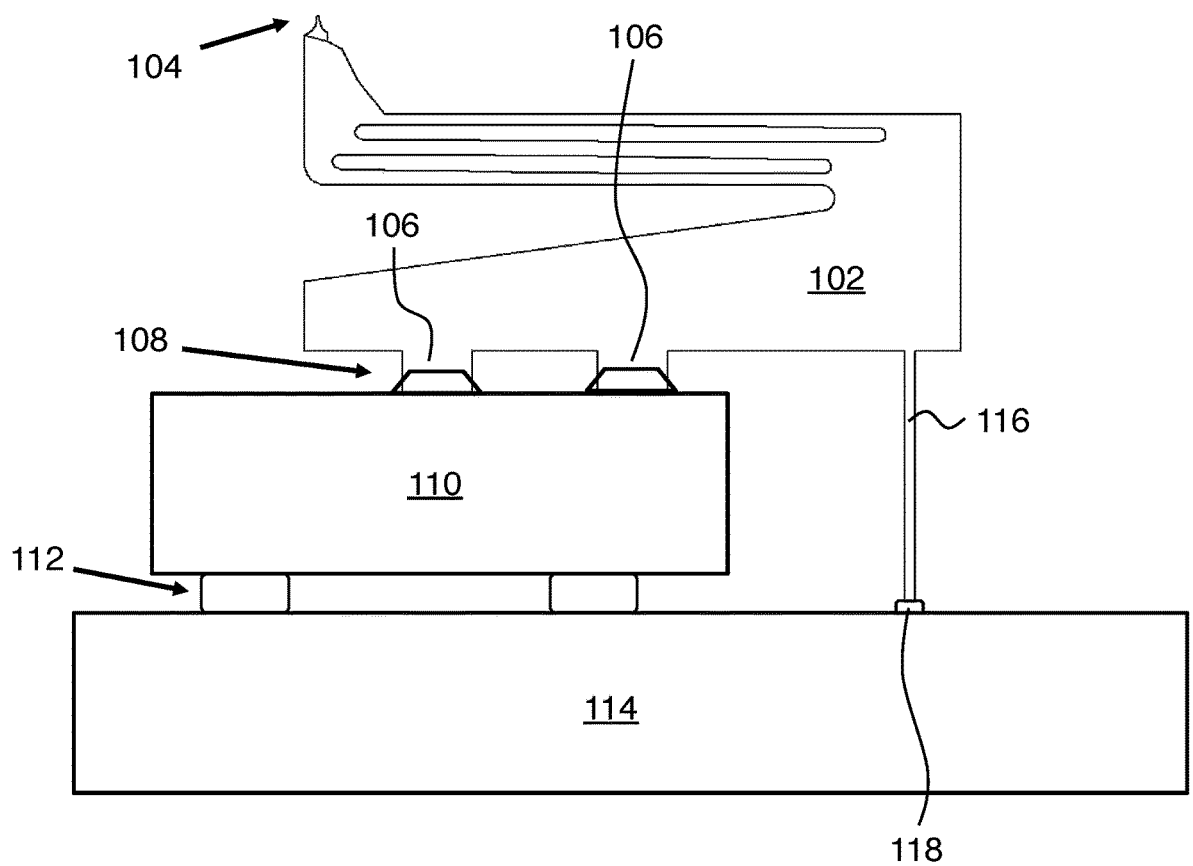
FIG. 1 shows an exemplary embodiment of the invention.

FIG. 1 shows an exemplary embodiment of the invention. Here a probe array includes a space transformer 114, and two or more probe carrier plates 110 mechanically affixed to the space transformer via carrier plate bonds 112. Here only one probe carrier plate is shown for ease of illustration, but examples of multiple probe carrier plates are shown below. Each of the probe carrier plates has two or more probes 102 mechanically affixed to it via primary bonds 108 such that tips 104 of the probes face away from space transformer 114, as shown. Here also only one probe is shown for ease of illustration, but examples of multiple probes on a carrier plate are shown below. Electrical connections between the probes 102 and the space transformer 114 are made by mechanically compliant spring features 116 of the probes that contact the space transformer without contacting the probe carrier plates via secondary bonds 118.

A corresponding method of making includes the following features:

i) providing two or more probe carrier plates;

ii) mechanically affixing two or more probes to each of the probe carrier plates to provide a probe carrier assembly corresponding to each of the probe carrier plates;

iii) providing a space transformer; and iv) after all of the probe carrier plates are fully populated with their corresponding probes, mechanically affixing the probe carrier assemblies to the space transformer. Here electrical connections between the probes and the space transformer are made by spring features of the probes that contact the space transformer without contacting the probe carrier plates. In this manner, the above described advantage of reduced fabrication lead time can be achieved. For example, lead time can be reduced by populating multiple probe carrier plates in parallel prior to final assembly of the carrier plate assemblies onto the space transformer.

Probes 102 can include one or more posts 106 configured to provide mechanical attachment points to the probe carrier plates.

Practice of the invention does not depend critically on the fabrication or structure of space transformer 114. For example, space transformer 114 can be ceramic or a printed circuit board (PCB), and it can have either low or high coefficient of thermal expansion (CTE). The probe carrier plates 110 are preferably a low CTE material. Probes 102 can be attached to the probe carrier plates 110 using a pick and place robot using primary bonding mechanisms 108. Spring features 116 can be electrically connected to space transformer 114 using secondary bonding mechanisms 118. Further details on the primary and secondary bonding are given below.

Figure 2:
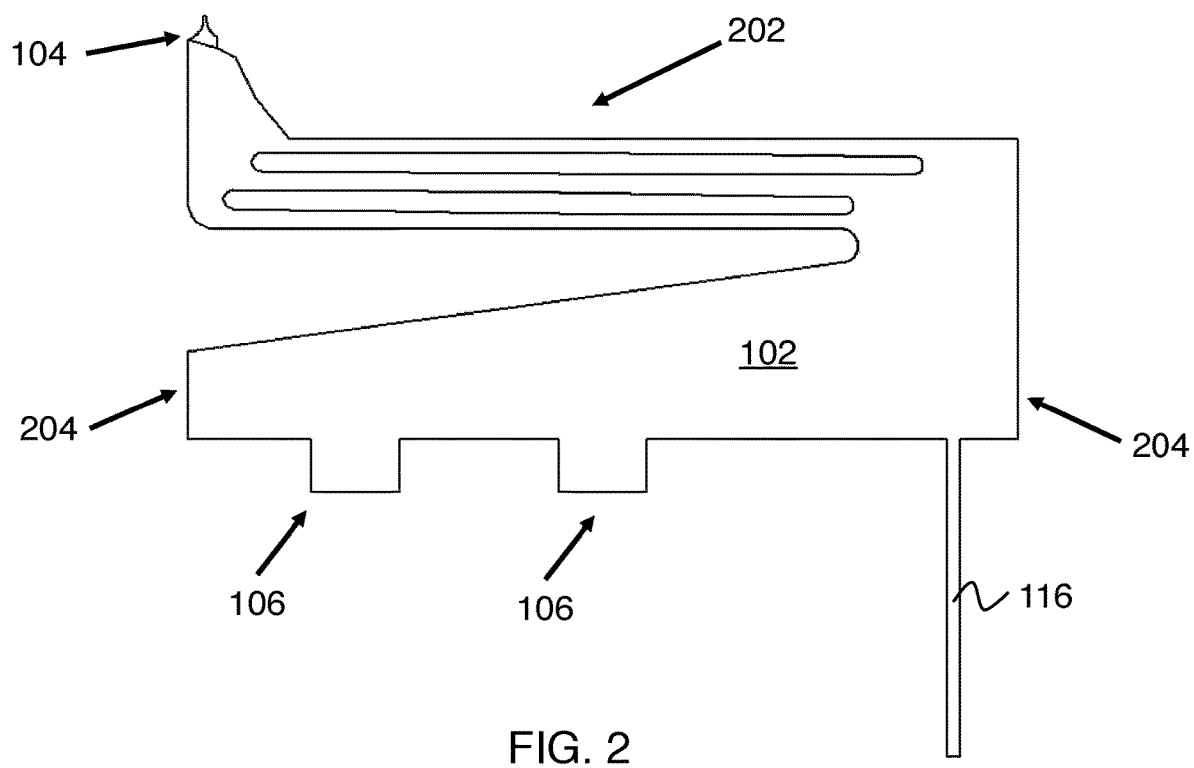
FIG. 2 shows exemplary features of preferred probe designs.
Figure 3A:
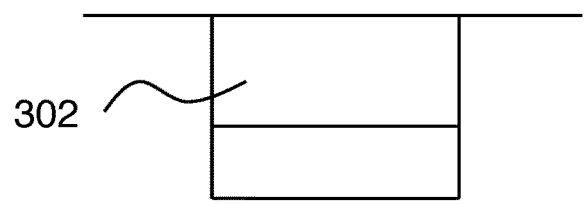
FIGS. 3A-G show exemplary design variations for attachment point features of the probes.
Figure 3B:
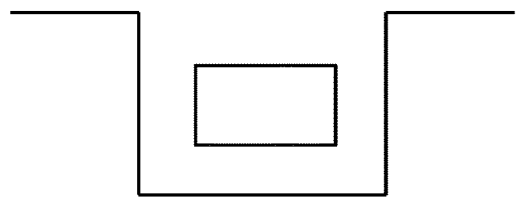
Figure 3C:
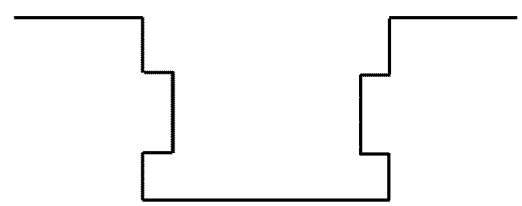
Figure 3D:
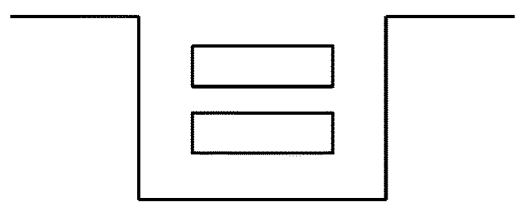
Figure 3E:
Figure 3F:
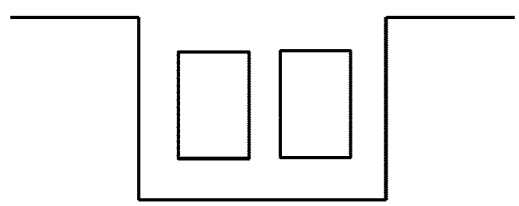
Figure 3G:

FIG. 2 shows exemplary preferred features of probe design. In this example, probe 102 includes flexure element 202 to provide mechanical compliance for tip 104. Probe 102 also includes alignment features 204 that can be used to align the probes in six degrees of freedom (here posts 106 can also be regarded as being such alignment features). Alignment features are preferably positioned within the body of probe 102, as shown, to enable precise positioning of the probe tip relative to all other probe tips in the probe array. In this example, alignment features 204 are for lateral alignment and posts 106 are for vertical alignment. More than one spring feature 116 could be used for mechanical or electrical considerations such as strength of attachment or current carrying capability to the space transformer. Similarly, one or more posts 106 can be used to define attachment points between probes and the probe carrier plates, as based on mechanical considerations such as strength of attachment.

FIGS. 3A-G show exemplary design variations for attachment point features of the probes. These variations mainly relate to optimizing the primary bonding between probes and probe carrier plates, so that topic will be considered here. Probes are preferably aligned and positioned to probe carrier plates using a pick and place robot. Probes are then bonded into the correct X,Y,Z location by using adhesive, solder paste, interface materials, etc. The bonding material is preferably designed to have very low shrinkage during post processing such as thermal, UV, laser, hot air etc. and forms a firm bonding connection between the probe feet and the carrier plate. Geometrical modifications such as holes, grooves, teeth, hill and valley (FIGS. 3B-G) of the probe feet can be used to improve adhesion and prevent the bonding material from wicking up beyond the probe feet. Another method to prevent wicking up of bonding material is to coat the probe with a wicking-resistant coating (e.g., 302 on FIG. 3A). Suitable materials for such a coating include metals such as Aluminum, Nickel, Titanium, Tungsten, Molybdenum, etc. and parylene. Primary bonding can also be optimized to improve adhesion by surface treatment of probe feet and/or the probe carrier plates, including but not limited to: chemical etching, physical etching, soda blasting, sand blasting, UV irradiation, and laser irradiation.

Geometrical features of the probes can be configured to expedite close-packing of the probes in the probe array. FIGS. 4A-C show a first exemplary approach for close packing probes on a carrier plate. Here probe 402 has probe feet 402a, 402b and probe spring feature 402c arranged as shown. Similarly, probe 404 has probe feet 404a, 404b and probe spring feature 404c arranged as shown. FIG. 4C shows a top view of a probe array made up of alternating probes 402 and 404 as shown. From this view it is apparent that the different configurations of probe feet and probe spring features on probes 402 and 404 allows the probe array pitch (i.e. the spacing between adjacent probes) to be less than it would need to be for an array of only probes 402 or an array of only probes 404. Here the ovals in the view of FIG. 4C schematically represent the bonds associated with the indicated probe features.

Figure 5A:
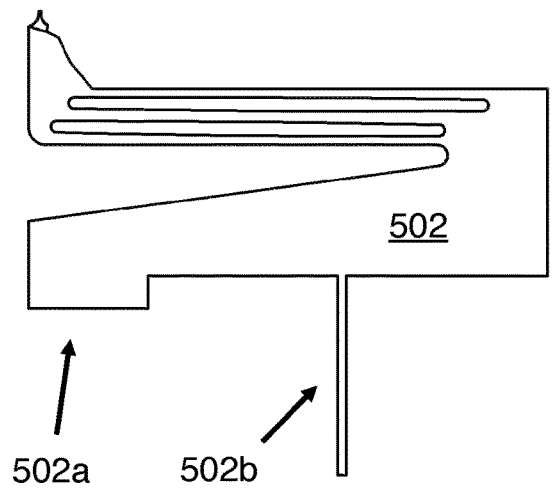
FIGS. 5A-C show a second exemplary approach for close packing probes on a carrier plate.
Figure 5B:
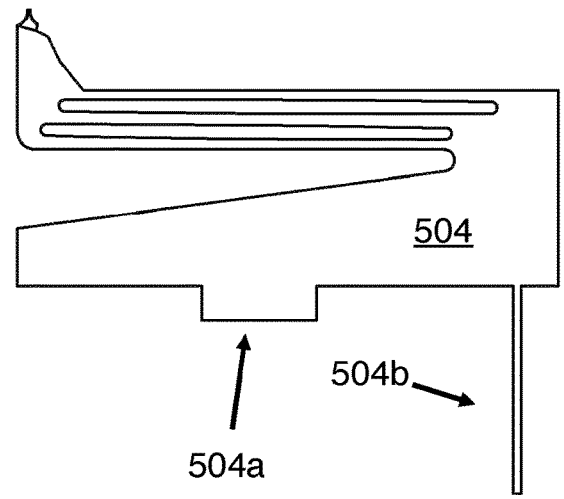
Figure 5C:
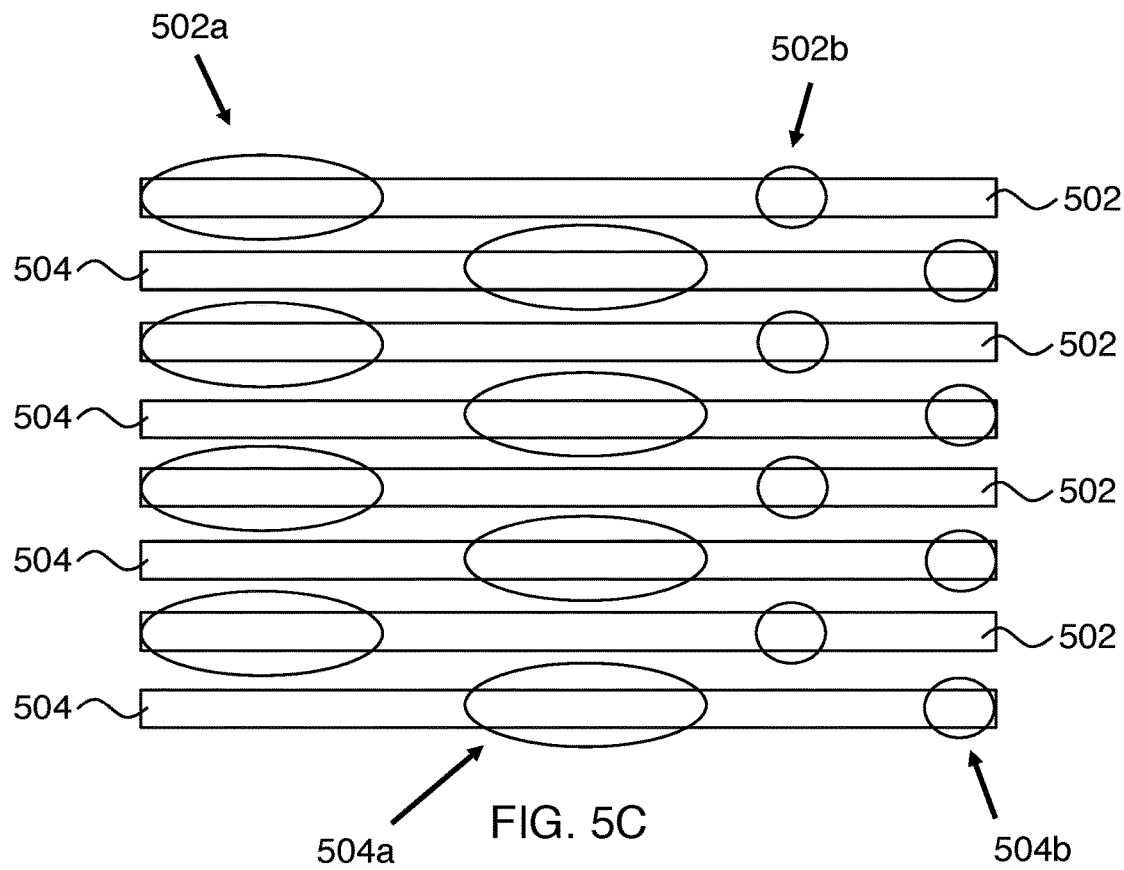

FIGS. 5A-C show a second exemplary approach for close packing probes on a carrier plate. Here probe 502 has probe foot 502a and probe spring feature 502b arranged as shown. Similarly, probe 504 has probe foot 504a and probe spring feature 504b arranged as shown. FIG. 5C shows a top view of a probe array made up of alternating probes 502 and 504 as shown. Here also it is apparent that the different configurations of probe feet and probe spring features on probes 502 and 504 allows the probe array pitch to be less than it would need to be for an array of only probes 502 or an array of only probes 504.

In both these examples, adjacent probes in the probe array have their respective posts staggered with respect to each other, whereby a spacing between the adjacent probes can be reduced.

Figure 6:
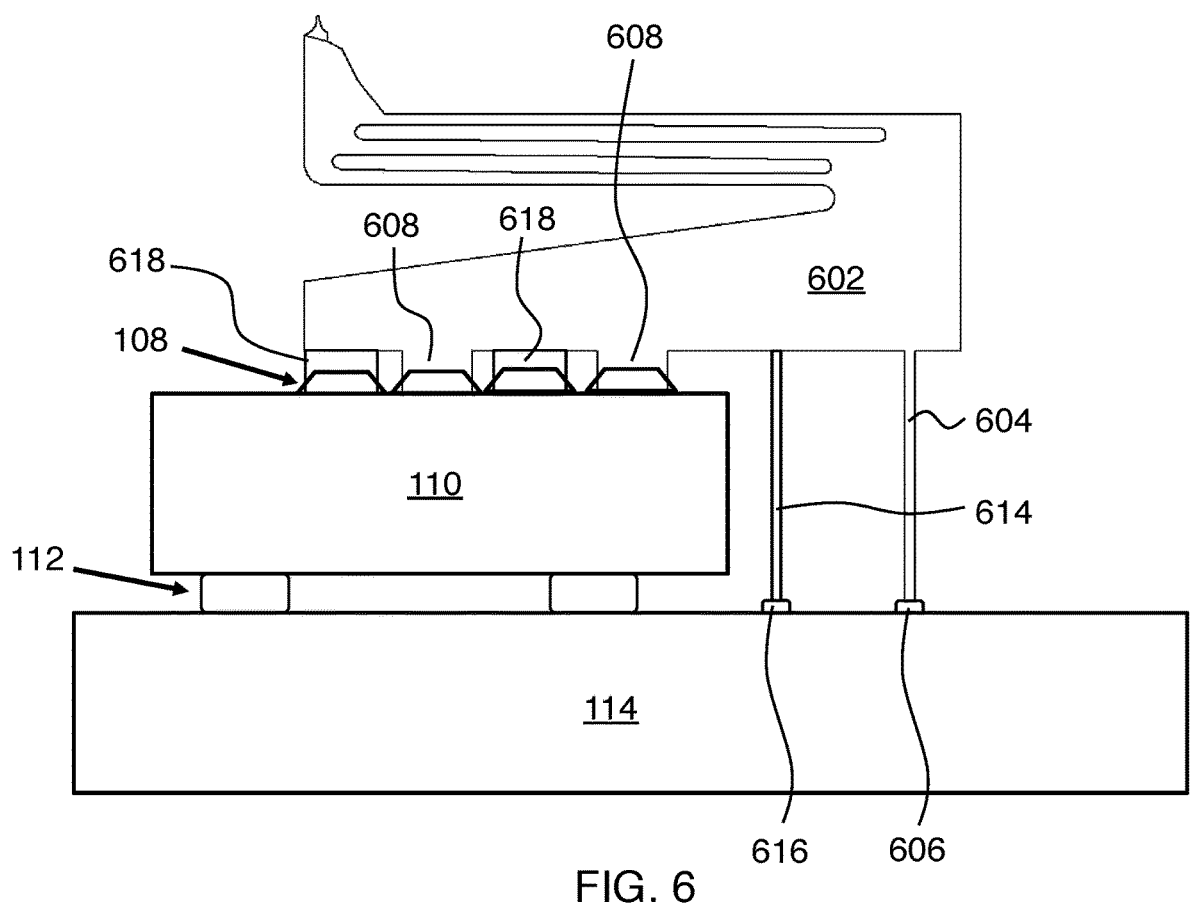
FIG. 6 is a side view of the configuration of FIG. 4C.

FIG. 6 is a side view of the configuration of FIG. 4C. Here probe 602 has probe feet 608 and probe spring feature 604 making contact to space transformer 114 at secondary bond 606. A probe right behind probe 602 in this view has probe feet 618 and probe spring feature 614 making contact to space transformer 114 at secondary bond 616. Here bonds 108 are primary bonds as described above.

Practice of the invention does not depend critically on details of the secondary bonding of the probe spring features to the space transformer. Suitable secondary bonding methods include, but are not limited to: solder reflow, thermocompression, local hot air curing of an adhesive or solder, electrically conductive adhesive, tape-automated bonding (TAB), wire bonding, laser bonding, piezo bonding, and solder jetting with a laser.

Figure 7:
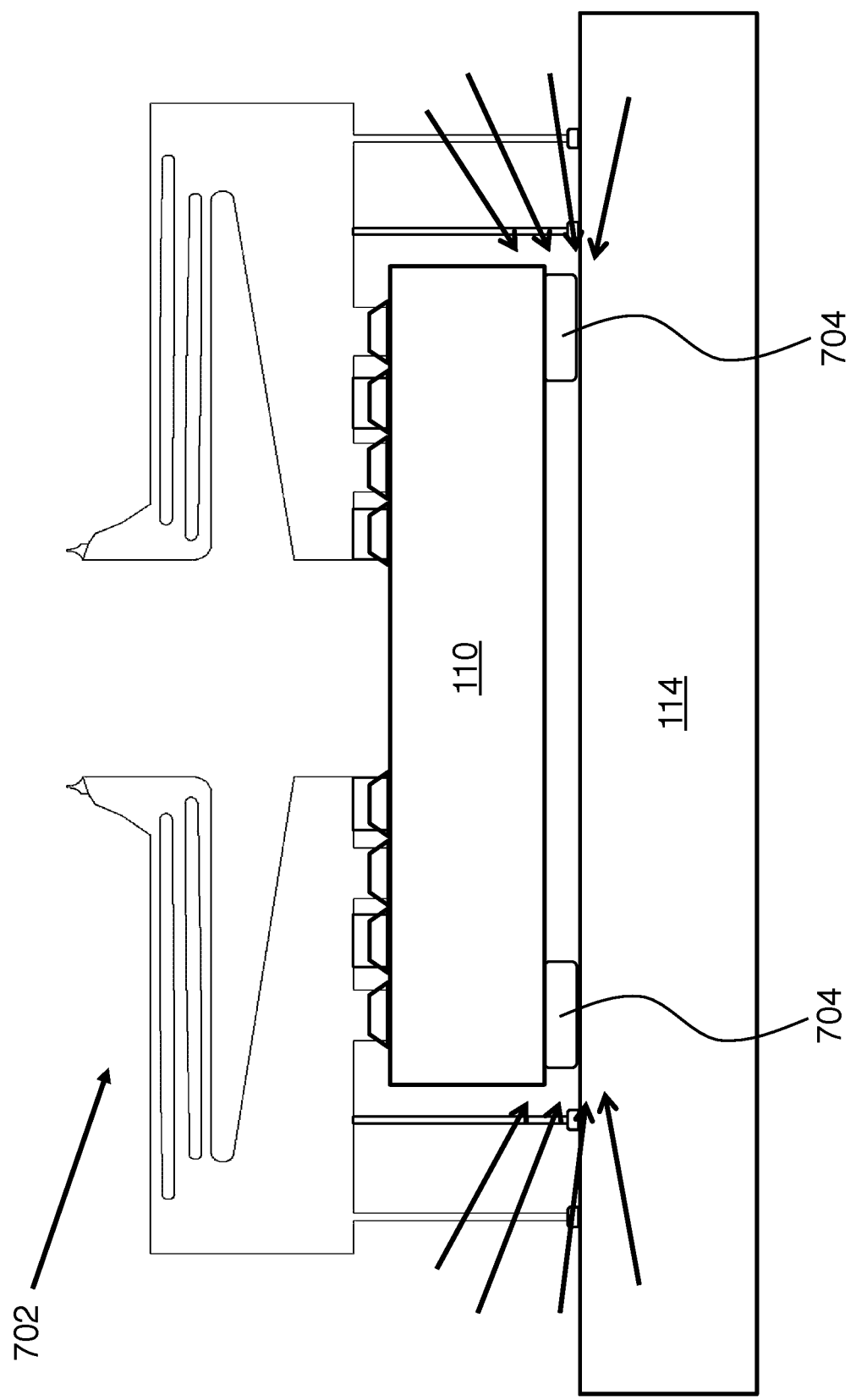
FIG. 7 shows a first example of bonding a carrier plate to a space transformer.

FIG. 7 shows a first example of bonding a carrier plate to a space transformer. In this example, it is assumed that probe carrier plate 110 having probes 702 attached to it is a low CTE ceramic. For a ceramic probe carrier plate 110 the attachment to space transformer 114 can be performed using pick and place robot that can precisely position the carrier plates in all six degrees of freedom and locked in position using adhesives or solder 704 that can be processed using IR Convection, Conduction, UV, laser, X-ray, E-beam, hot air etc. The adhesives or solder 704 need to be placed in the perimeter for localized post processing, as shown.

Figure 8:
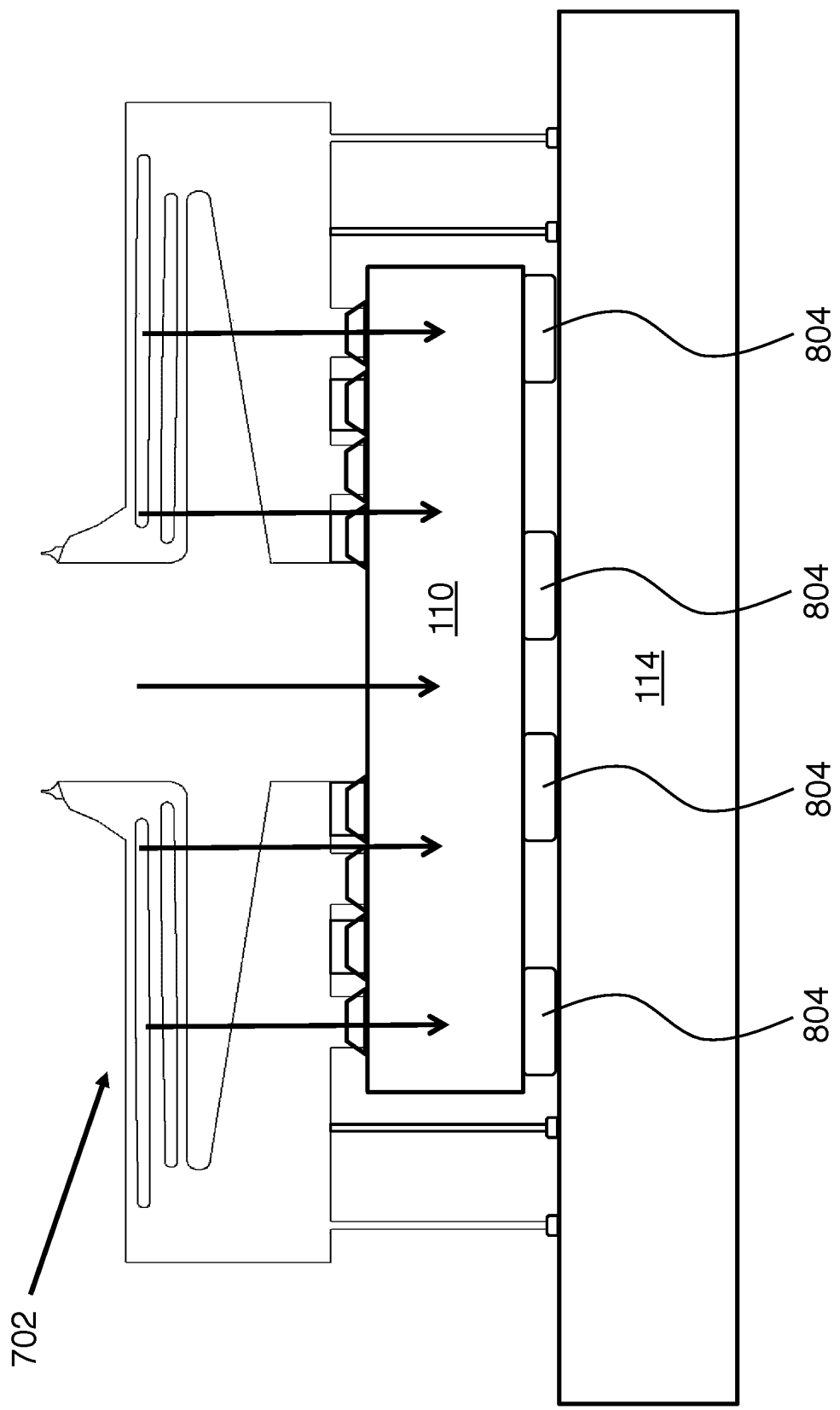
FIG. 8 shows a second example of bonding a carrier plate to a space transformer.

FIG. 8 shows a second example of bonding a carrier plate to a space transformer. In this example, it is assumed that probe carrier plate 110 having probes 702 attached to it is a low CTE glass-like material. For a glass probe carrier plate 110 the attachment to space transformer 114 can be performed using pick and place robot that can precisely position the carrier plates in all six degrees of freedom and locked in position using adhesives or solder 804 that can be processed using IR Convection, Conduction, UV, laser, X-ray, E-beam, hot air etc. The adhesives or solder 804 can be placed anywhere on the carrier plate, as shown. In the examples of FIGS. 7-8, processing of the solder/adhesive is schematically shown with heavy arrows.

Figure 9:
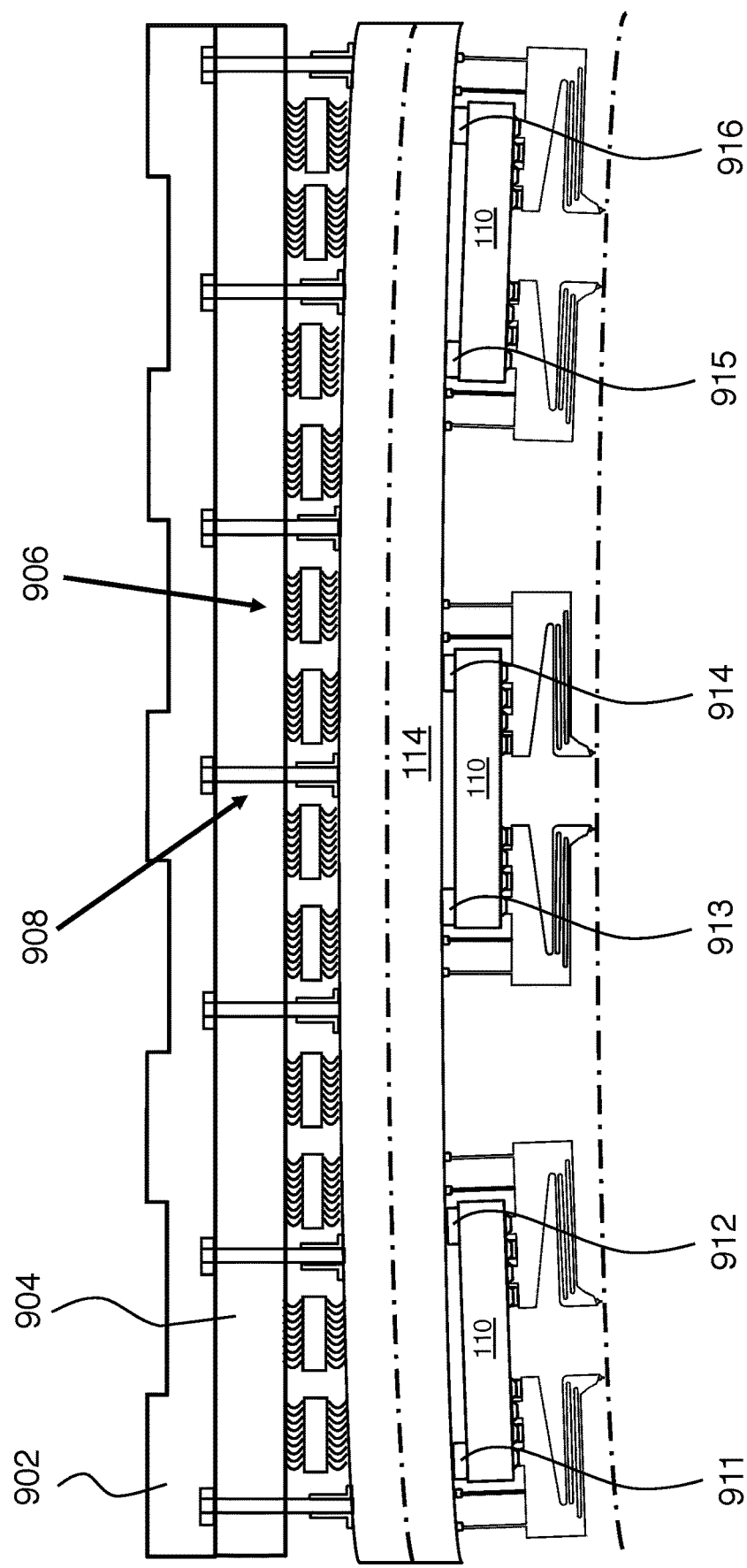
FIG. 9 shows how deviation of the space transformer from flatness can affect the planarity of the array of probe tips.

FIG. 9 shows how deviation of the space transformer from flatness can affect the planarity of the array of probe tips. Here space transformer 114 is attached to main PCBA (printed circuit board assembly) 904 and the tester side mechanical interface 902 via compliant electrical connections 906 and mechanical connections 908. Multiple probe carrier plates 110 are disposed on space transformer 114. Each of these probe carrier plates includes multiple probes as described above in connection with FIG. 6. If bonds 911, 912, 913, 914, 915, 916 between the probe carrier plates 110 and the space transformer 114 all have the same thickness, then deviations of space transformer 114 from planarity (dash-dotted line) lead to corresponding deviations of the probe tips from planarity (dashed line).

Figure 10:
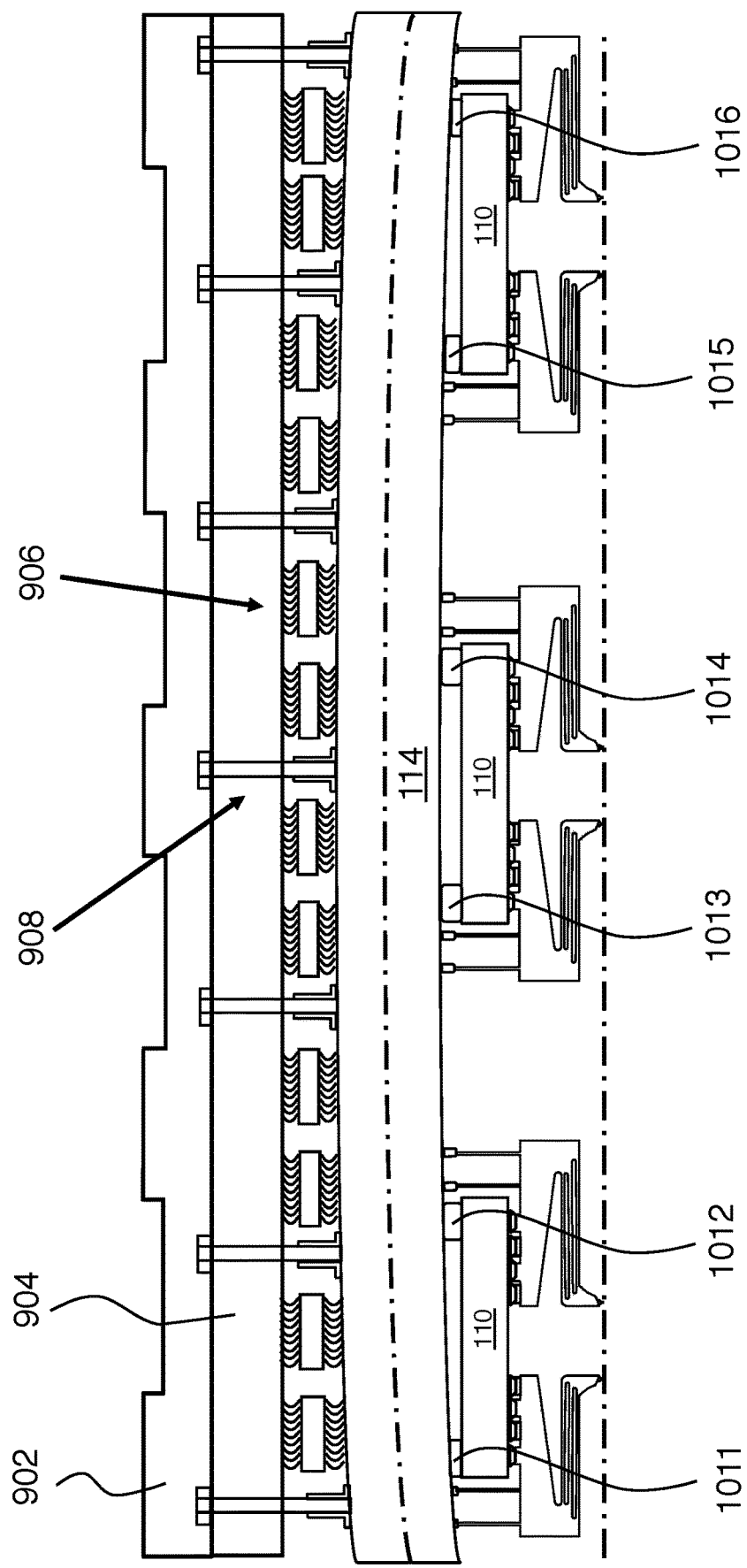
FIG. 10 shows how variable bond thicknesses between carrier plates and the space transformer can compensate for lack of space transformer flatness as in FIG. 9.

FIG. 10 shows how variable bond thicknesses between carrier plates and the space transformer can compensate for lack of space transformer flatness as in FIG. 9. Here bonds 1011, 1012, 1013, 1014, 1015, 1016 between the probe carrier plates 110 and the space transformer 114 have different thicknesses as needed to provide planarity of the probe tips (dashed line) despite the deviation of space transformer 114 from planarity (dash-dotted line)

This can be regarded as the space transformer having a locally adjustable vertical displacement configured to make the tips of the probes coplanar for all probes of the probe array. More specifically, the locally adjustable vertical displacement is provided by bonds between the carrier plates and the space transformer having a fabrication-adjustable bond thickness for each of the carrier plates. Such control of bond thickness is readily available with pick and place robotic technology.

Here it is important to note that the spring features of the probes can be (and preferably are) designed to have sufficient mechanical compliance to accommodate a range of probe carrier plate to space transformer bond thickness as will be needed for this planarity adjusting capability.

The invention claimed is:

1. A probe array comprising:
   a space transformer;
   two or more probe carrier plates mechanically affixed to a surface of the space transformer, wherein each of the probe carrier plates has two or more probes mechanically affixed to it such that tips of the probes face away from the space transformer;
   wherein the probe carrier plates are laterally separated from each other with respect to the surface of the space transformer;
   wherein electrical connections between the probes and the space transformer are made by spring features of the probes that contact the space transformer without contacting the probe carrier plates;
   wherein the probes of the probe carrier plates are configured to make electrical contact to a device under test.

2. The probe array of claim 1, wherein the probes include one or more posts configured to provide mechanical attachment points to the probe carrier plates.

3. The probe array of claim 2, wherein adjacent probes in the probe array have their respective posts staggered with respect to each other, whereby a spacing between the adjacent probes can be reduced.

4. The probe array of claim 1, wherein the space transformer has a locally adjustable vertical displacement configured to make the tips of the probes coplanar for all probes of the probe array.

5. The probe array of claim 4, wherein the locally adjustable vertical displacement is provided by bonds between the carrier plates and the space transformer having a fabrication-adjustable bond thickness for each of the carrier plates.

6. A method of making a probe array, the method comprising:
   providing two or more probe carrier plates;
   mechanically affixing two or more probes to each of the probe carrier plates to provide a probe carrier assembly corresponding to each of the probe carrier plates;
   providing a space transformer;
   after all of the probe carrier plates are fully populated with their corresponding probes, mechanically affixing the probe carrier assemblies to the space transformer;
   wherein electrical connections between the probes and the space transformer are made by spring features of the probes that contact the space transformer without contacting the probe carrier plates.

7. The method of claim 6, wherein the space transformer has a locally adjustable vertical displacement configured to make the tips of the probes coplanar for all probes of the probe array.

8. The method of claim 7, wherein the locally adjustable vertical displacement is provided by bonds between the carrier plates and the space transformer having a fabrication-adjustable bond thickness for each of the carrier plates, and further comprising adjusting bond thicknesses to provide planarity of the probe tips.

* * * * *